United States Patent
Keum

(10) Patent No.: US 8,013,423 B2
(45) Date of Patent: Sep. 6, 2011

(54) METHOD FOR FABRICATING A METAL INTERCONNECTION USING A DUAL DAMASCENE PROCESS AND RESULTING SEMICONDUCTOR DEVICE

(75) Inventor: Dong-Yeal Keum, Seoul (KR)

(73) Assignee: Dongbu HiTek Co., Ltd., Seoul (KR)

( * ) Notice: Subject to any disclaimer, the term of this patent is extended or adjusted under 35 U.S.C. 154(b) by 254 days.

(21) Appl. No.: 12/492,019

(22) Filed: Jun. 25, 2009

(65) Prior Publication Data

US 2009/0261475 A1    Oct. 22, 2009

Related U.S. Application Data

(63) Continuation of application No. 11/613,815, filed on Dec. 20, 2006, now Pat. No. 7,566,658.

(30) Foreign Application Priority Data

Dec. 26, 2005    (KR) .................. 10-2005-0129663

(51) Int. Cl.
   *H01L 23/02* (2006.01)

(52) U.S. Cl. .............. 257/577; 257/579; 257/E21.027; 257/E21.252; 257/E21.577; 257/E21.579; 257/E23.152; 257/E23.167

(58) Field of Classification Search .......... 257/577–579, 257/E21.027, 252–257, 23.152, 167
See application file for complete search history.

(56) References Cited

U.S. PATENT DOCUMENTS

| | | | |
|---|---|---|---|
| 5,821,169 A | 10/1998 | Nguyen et al. | |
| 6,251,791 B1 | 6/2001 | Tsai et al. | |
| 6,348,408 B1 | 2/2002 | Kasai | |
| 6,573,148 B1 | 6/2003 | Bothra | |
| 7,112,537 B2 * | 9/2006 | Keum | 438/738 |
| 7,179,734 B2 * | 2/2007 | Keum | 438/623 |
| 7,247,565 B2 * | 7/2007 | Keum | 438/687 |
| 7,268,434 B2 | 9/2007 | Nakashima | |
| 7,566,658 B2 * | 7/2009 | Keum | 438/668 |
| 2004/0072436 A1 | 4/2004 | RamachandraRao et al. | |
| 2004/0201108 A1 | 10/2004 | Kanamura | |
| 2005/0153542 A1 * | 7/2005 | Keum | 438/638 |
| 2005/0260822 A1 * | 11/2005 | Keum et al. | 438/382 |
| 2006/0006545 A1 | 1/2006 | Wu et al. | |

* cited by examiner

*Primary Examiner* — Michael S Lebentritt
(74) *Attorney, Agent, or Firm* — Sherr & Vaughn, PLLC

(57) ABSTRACT

A semiconductor device includes an interlayer insulating layer including a plurality of trenches connecting to a number of via holes formed on a semiconductor substrate including lower interconnections, wherein widths of the trenches are greater than widths of the via holes, and metal interconnections formed by burying metal thin films in the via holes and the trenches. Depths of the trenches are adjusted differently from each other depending on required resistances of the metal interconnections.

4 Claims, 4 Drawing Sheets

METHOD FOR FABRICATING A METAL INTERCONNECTION USING A DUAL DAMASCENE PROCESS AND RESULTING SEMICONDUCTOR DEVICE

The present application is a Continuation Application of a U.S. patent application Ser. No. 11/613,815 filed on Dec. 20, 2006 now U.S. Pat. No. 7,566,658, which claims priority under 35 U.S.C. 119 and 35 U.S.C. 365 to Korean Patent Application No. 10-2005-0129663 (filed on Dec. 26, 2005), which is hereby incorporated by reference in its entirety.

BACKGROUND

As the scale of semiconductor device integration increases, the width of metal interconnections used in the semiconductor device decreases, resulting in an increase of resistance and signal transmission delay in the metal interconnections. To solve the problem of signal transmission delay, a multi-layered interconnection structure may be substituted for single-layered interconnection structures.

However, as distances between metal interconnection layers decrease in the multi-layered interconnection structure, parasitic capacitance and parasitic resistance (impedance) between adjacent metal interconnections in the same layer increase, and therefore, the operational speed of the semiconductor device is reduced. With very fine interconnections in the device, signal transmission delays caused by parasitic capacitance in the interconnections significantly affects the operational characteristics (for example, speed, power consumption, and reliability, among others) of the semiconductor device. In order to reduce the parasitic capacitance between the interconnections, the widths of the interconnections may be reduced and the thickness of interlayer insulating layers may be enlarged. Accordingly, to form interconnections of metal having low resistivity and interlayer insulating films of material having a low dielectric constant, a material such as copper (Cu) may be used as the interconnection material. However, since the vapor pressure of the reactant generated while etching copper is low, dry etching copper is difficult.

Accordingly, a damascene or dual damascene process may be used in forming copper interconnections by forming via holes and/or trenches in an interlayer insulating layer, filling the via holes and/or the trenches with copper and then planarizing the copper with the insulating layer.

Particularly, the dual damascene process includes the steps of forming an etch stop layer over a semiconductor substrate, forming a first silane layer, an insulating layer and a second silane layer thereon, and etching selectively the layers to form via holes therein. Then, the via holes are filled with a photoresist film, and a trench pattern is formed over the second silane layer. Subsequently, using the trench pattern as a mask, an RIE (reactive ion etching) is performed on the second silane layer and the insulating layer to form trenches therein. A barrier metal film is formed over inside walls of the via holes and the trenches, which are then filled with a metal thin film. The metal thin film is then patterned to form metal interconnections to connect to electrodes and pads of the device.

In some instances, individual metal interconnections need to have a resistance different from the others depending on their function. The widths of the metal interconnections may be adjusted individually. When forming metal interconnections having a relatively lower resistance in a single layer, the widths of the interconnections may be adjusted to be wider.

FIGS. 1 and 2 illustrate plan and cross-sectional views of metal interconnections that are fabricated using a dual damascene process.

As shown in FIGS. 1 and 2, metal interconnections 10 and 20 are formed to have different widths, and therefore different resistances. For example, metal interconnection 10 has a width W and a relatively higher resistance while metal interconnection 20 has a width W' (greater than width W) and a relatively a lower resistance. The metal interconnections are spaced by a minimum distance S.

In general, a minimum design rule is used in forming metal interconnections in semiconductor devices. However, metal interconnections having a lower resistance often need to be formed. These metal interconnections should have a relatively greater width. This also means that the size of the semiconductor device is increased as much as the size for the metal interconnections. For example, when metal interconnections having a lower resistance need to be formed, but without increasing trench depths (see FIG. 2), the widths of those metal interconnections may be enlarged.

However, the chip size of semiconductor devices needs to be minimized to achieve large scale integration, a high yield per wafer, and other advantages. However, it is difficult to increase the integration level, and minimize chip size using a dual damascene process in which the widths of interconnections need to be enlarged.

SUMMARY

Embodiments are directed to a semiconductor device; and particularly to a method for fabricating a metal interconnection using a dual damascene process, and a semiconductor device made by the process.

Embodiments relate to a method for using a dual damascene process to form a metal interconnection with a relatively lower resistance and without an enlarged width.

Embodiments relate to a method for forming a metal interconnection using a dual damascene process, thereby fabricating a highly integrated semiconductor device.

Embodiments relate to a semiconductor device having a metal interconnection with a relatively lower resistance without enlarging the width thereof.

Embodiments relate to a method for forming a metal interconnection using a dual damascene process, including the steps of: forming sequentially an etch stop layer, a first silane layer, an insulating layer and a second silane layer over a semiconductor substrate; etching selectively the first silane layer, the insulating layer and the second silane layer to form one or more via holes; filling the via holes with a filler; forming a first etching mask for forming a first trench connecting to the via holes on the second silane layer; and, using the first etching mask, etching the second silane layer, the insulating layer and the filler to form the first trench having a predetermined depth connecting to one of the via holes; forming a second etching mask for forming a second trench on an entire surface of the semiconductor substrate, and using the second etching mask, etching the second silane layer, the insulating layer and the filler to form a second trench connecting to one of the via holes other than the via hole connecting to the first trench, wherein a depth of the second trench is different from that of the first trench; removing the filler in the via holes; removing a part of the etch stop layer exposed at the bottom of the via holes; and forming metal interconnections to fill the via holes and the trenches.

Embodiments relate to a semiconductor device including: an interlayer insulating layer including a plurality of trenches connecting to a number of via holes formed on a semiconductor substrate including lower interconnections, wherein widths of the trenches are greater than widths of the via holes; and metal interconnections formed by filling the via holes and the trenches with a metal film, wherein depths of the trenches vary depending on required resistances of the metal interconnections.

BRIEF DESCRIPTION OF THE DRAWINGS

Example

DETAILED DESCRIPTION

Figure 1:
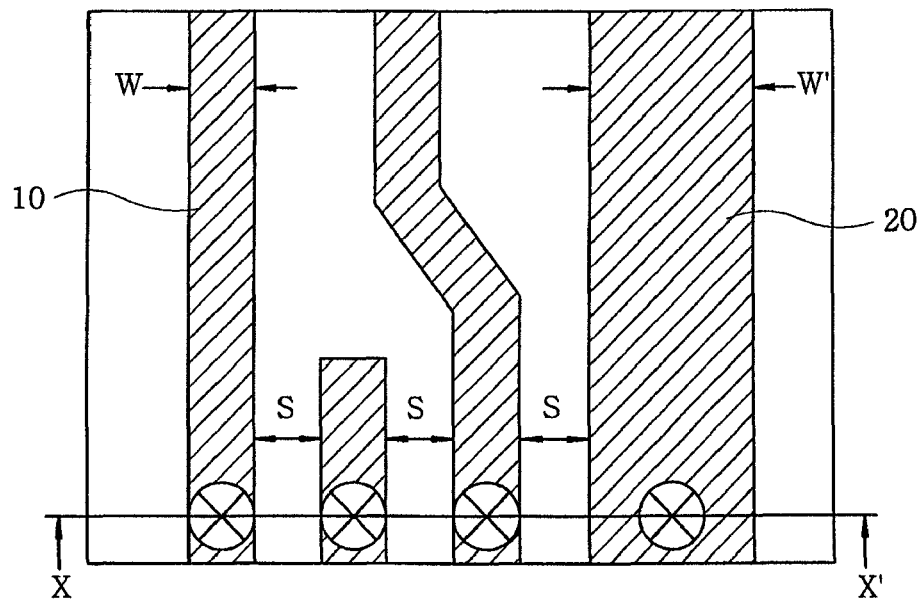
FIG. 1 illustrates a plan view of metal interconnections that are fabricated using a dual damascene process.
Figure 2:
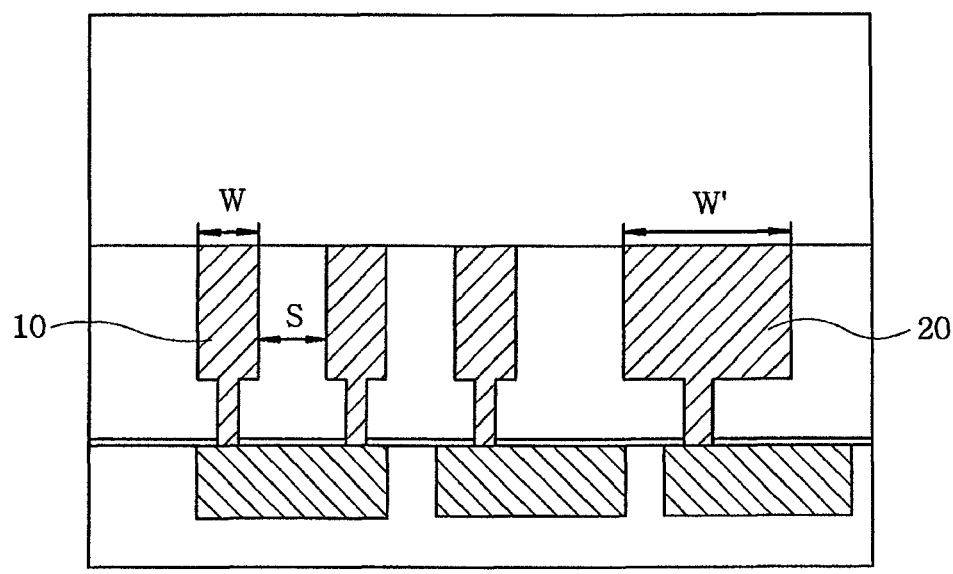
FIG. 2 depicts a cross-sectional view taken along a line X-X'.

In the drawings, in order to represent various layers and regions in a clear manner, their thicknesses are represented to be enlarged. Through the entire specification, like elements are designated by the same reference numerals. If a portion such as a layer, a film, a region or a plate is referred to be positioned on another portion, such an expression may incorporate a case in which there exists still another portion therebetween as well as a case in which the portion is positioned right on said another portion. On the contrary, if a portion is referred to be positioned right on another portion, it means that there is no still another portion therebetween.

Figure 3:
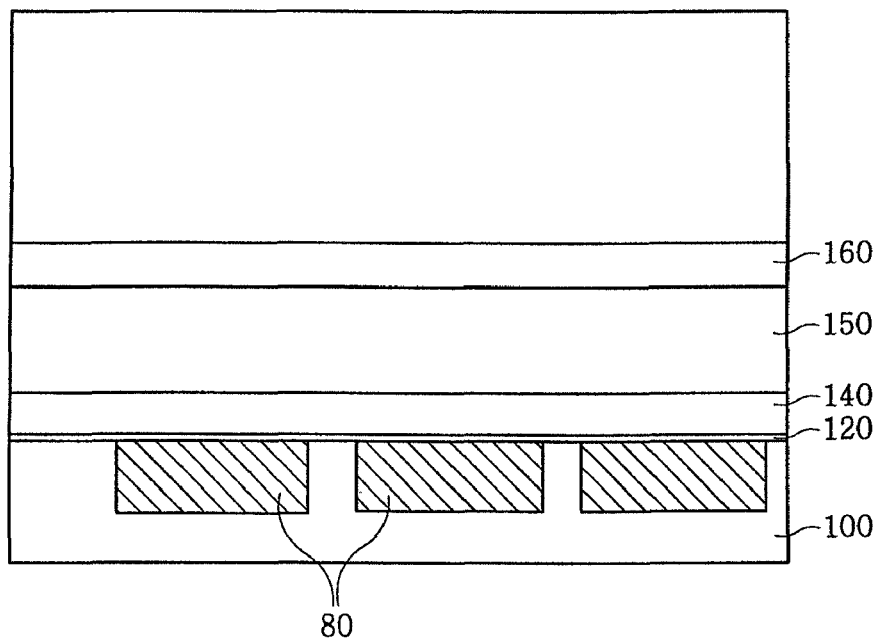
FIGS. 3 to 8 show cross-sectional views for explaining a method for forming a metal interconnection using a dual damascene process in accordance with embodiments.

Referring to FIG. 3, an etch stop layer 120, a first silane layer 140, an insulating layer 150 and a second silane layer 160 are sequentially formed over a semiconductor substrate 100. In one embodiment, the etch stop layer 120 includes SiN, and the insulating layer 150 includes insulating material of low dielectric constant such as FSG(Fluorine Silicate Glass), PSG(phosphorous silicate glass), BPSG(boron phosphorous silicate glass) and USG(un-doped silicate glass), or their equivalents. Further, the first and second silane layers 140, 150 may include a material such as $SiH_4$. In this embodiment, the first silane layer 140, the insulating layer 150 and the second silane layer 160 form an interlayer insulating layer.

A lower interconnection structure may be formed under the etch stop layer 120, for example, lower contacts and/or interconnections 80 formed in the semiconductor substrate 100. In certain embodiments, such interconnections 80 may include contact structures that are fabricated using a damascene process.

Figure 4:
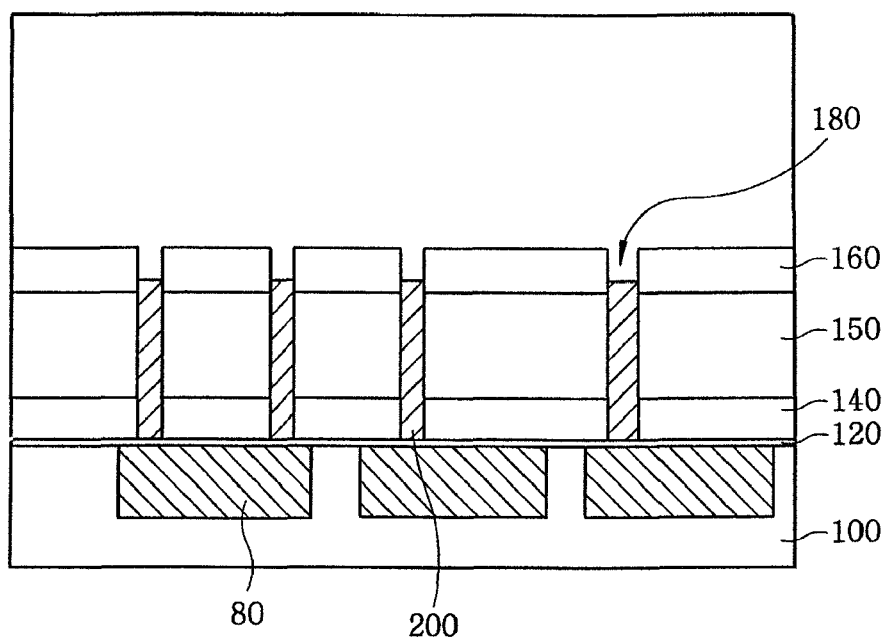

Referring to FIG. 4, the second silane layer 160, the insulating layer 150 and the first silane layer 140 are selectively etched, to thereby form via holes 180 extending to the lower interconnections 80. The etch stop layer 120 positioned below the first silane layer 140 serves as a barrier for stopping the etching of the via hole 180.

Thereafter, in order to prevent the via holes 180 from being eroded during a subsequent process of forming trenches, a filler 200 such as Novolac photoresist, is deposited in and buries the via hole 180. Other equivalent materials may be used to serve this function.

Figure 5:
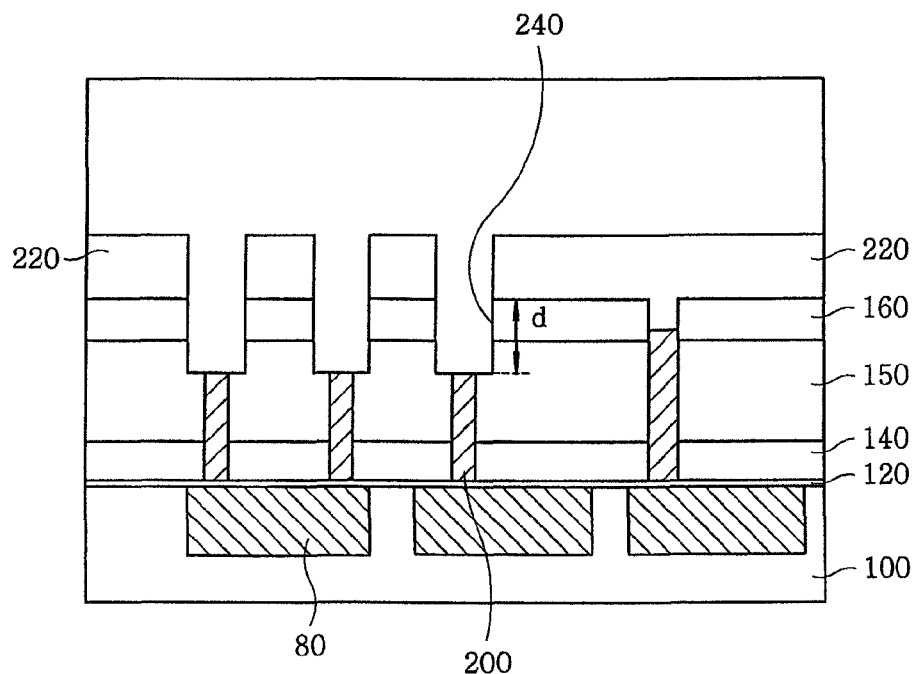

Referring to FIG. 5, an anti-reflection film (not illustrated) is formed over the second silane layer 160, and an etching mask 220 is formed thereon using a photoresist pattern. Using the etching mask 220, first trenches 240 having a depth d are formed to connect to the via holes, and then the etching mask 220 is removed. It should be noted that trenches are not yet formed above the vias designated for metal interconnections of low resistance.

Figure 6:
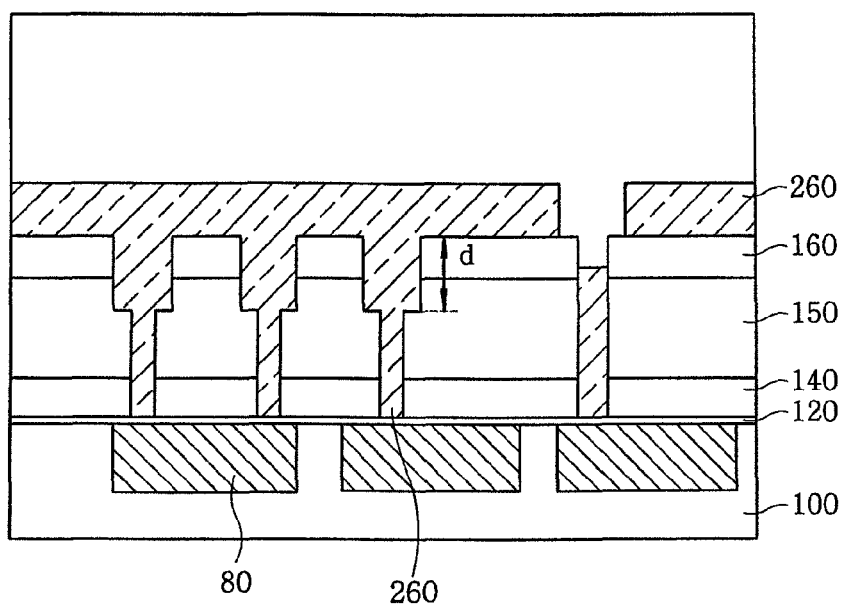

Referring to FIG. 6, in order to form low resistance metal interconnections, a second etching mask 260 is formed, for example, using a photoresist pattern.

Figure 7:
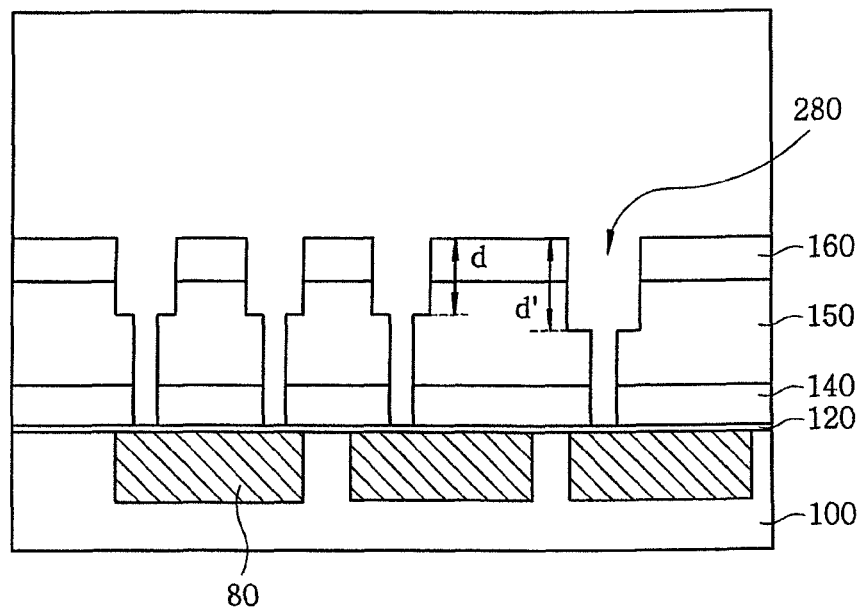

Referring to FIG. 7, using the second etching mask 260, second trenches 280 having a depth d' (d'>d) are formed to connect to the via holes, and then the etching mask is removed. Thereafter, the filler 200 remaining in the via holes is removed. Then, the first and second trenches 240 and 280 and the via holes 180 are buried with a conductive film such as Cu film.

Figure 8:
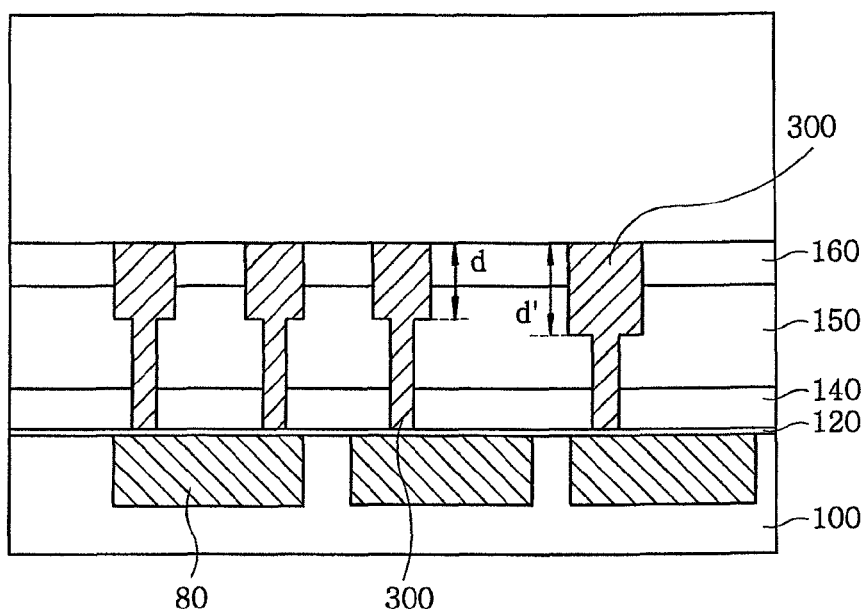

Subsequently, as shown in FIG. 8, metal interconnections 300 including contacts are formed by performing chemical-mechanical polishing (CMP) on the resultant structure. As shown in FIG. 8, since the depth d' of the second trenches 280 is greater than that (d) of the first trenches 240, the resistance of metal interconnections filling the second trenches 280 is lower than that of metal interconnections filling the first trenches 240.

In the above-described embodiments, the depth of the second trenches 280 may be adjusted depending on required resistance of metal interconnections filled therein. Also, by adjusting the depths of one or more of the trenches differently, metal interconnections having various resistances can be implemented. Furthermore, by setting the widths of metal interconnections filling the trenches to be uniform, characteristics of a CMP process performed on the metal layers can be improved.

Accordingly, by adjusting the depths of trenches for metal interconnections, metal interconnections having low resistances can be fabricated without having to enlarging the widths of the metal interconnections, thereby producing highly integrated semiconductor devices.

In accordance with the embodiments, since metal interconnections with the low resistance can be used without enlarging the chip size by forming the trenches to have different depths from each other, a high integration of the semiconductor device can be achieved. Further, it is possible to improve the characteristics of the CMP for the metal film by forming the metal interconnections to have an identical width.

It will be obvious and apparent to those skilled in the art that various modifications and variations can be made in the embodiments disclosed. Thus, it is intended that the disclosed embodiments cover the obvious and apparent modifications and variations, provided that they are within the scope of the appended claims and their equivalents.

What is claimed is:

1. A semiconductor device comprising:
    an interlayer insulating layer having a plurality of trenches overlying and connecting to a plurality of via holes formed on a semiconductor substrate including lower interconnections, wherein widths of the trenches are greater than widths of the via holes; and
    metal interconnections filling the via holes and the trenches,
    wherein depths of the trenches are varied.

2. The device of claim 1, wherein the metal interconnections include Cu.

3. The device of claim 1, wherein the depths of the trenches are varied depending on required resistances of the metal interconnections.

4. The device of claim 1, wherein the trenches have widths which are approximately equal to each other.

* * * * *